US011053435B2

(12) United States Patent
Masson et al.

(10) Patent No.: US 11,053,435 B2
(45) Date of Patent: *Jul. 6, 2021

(54) QUANTUM DOT (QD) DELIVERY METHOD

(71) Applicant: OSRAM Opto Semiconductors GmbH, Regensburg (DE)

(72) Inventors: Georgeta Masson, Lafayette, CA (US); Kari N. Haley, Portland, OR (US); Brian Theobald, Gladstone, OR (US); Benjamin Daniel Mangum, Tualatin, OR (US); Juanita N. Kurtin, Hillsboro, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 136 days.

This patent is subject to a terminal disclaimer.

(21) Appl. No.: 16/230,995

(22) Filed: Dec. 21, 2018

(65) Prior Publication Data

US 2019/0144743 A1    May 16, 2019

Related U.S. Application Data

(62) Division of application No. 14/196,123, filed on Mar. 4, 2014, now Pat. No. 10,202,543.

(Continued)

(51) Int. Cl.
*C09K 11/02* (2006.01)
*C08K 3/10* (2018.01)
(Continued)

(52) U.S. Cl.
CPC .............. *C09K 11/025* (2013.01); *C08K 3/10* (2013.01); *C08K 9/10* (2013.01); *C09K 11/02* (2013.01);
(Continued)

(58) Field of Classification Search
CPC ....... C09K 11/025; C09K 11/08; C09K 11/02; B82Y 30/00; B82Y 40/00; H01L 33/502; H01L 33/504
See application file for complete search history.

(56) References Cited

U.S. PATENT DOCUMENTS

| 5,105,822 A | 4/1992 | Stevens et al. |
| 6,710,366 B1 * | 3/2004 | Lee .................. B82Y 10/00 257/103 |

(Continued)

FOREIGN PATENT DOCUMENTS

| DE | 102005013070 A1 | 10/2005 |
| JP | 2007524119 A | 8/2007 |

(Continued)

OTHER PUBLICATIONS

European Search Opinion for European Patent Application No. 14759513.6, dated Oct. 26, 2016, 6 pages.

(Continued)

*Primary Examiner* — C Melissa Koslow
(74) *Attorney, Agent, or Firm* — Elliott, Ostrander & Preston, P.C.

(57) ABSTRACT

Quantum dot delivery methods are described. In a first example, a method of delivering or storing a plurality of nano-particles involves providing a plurality of nano-particles. The method also involves forming a dispersion of the plurality of nano-particles in a medium for delivery or storage, wherein the medium is free of organic solvent. In a second example, a method of delivering or storing a plurality of nano-particles involves providing a plurality of nano-particles in an organic solvent. The method also involves drying the plurality of nano-particles for delivery or storage, the drying removing entirely all of the organic solvent.

7 Claims, 14 Drawing Sheets

Related U.S. Application Data

(60) Provisional application No. 61/773,084, filed on Mar. 5, 2013.

(51) Int. Cl.
*C08K 9/10* (2006.01)
*C09K 11/08* (2006.01)
*H01L 33/50* (2010.01)
*B82Y 40/00* (2011.01)
*B82Y 30/00* (2011.01)

(52) U.S. Cl.
CPC ............ *C09K 11/08* (2013.01); *H01L 33/502* (2013.01); *H01L 33/504* (2013.01); *B82Y 30/00* (2013.01); *B82Y 40/00* (2013.01); *C08K 2201/011* (2013.01); *Y10S 977/89* (2013.01)

(56) References Cited

U.S. PATENT DOCUMENTS

| | | | |
|---|---|---|---|
| 7,041,362 B2 | 5/2006 | Barbera-Guillem | |
| 7,151,047 B2 | 12/2006 | Chan et al. | |
| 7,318,651 B2* | 1/2008 | Chua | B82Y 10/00 257/89 |
| 7,498,177 B2 | 3/2009 | Fuente et al. | |
| 7,598,314 B2 | 10/2009 | Lee et al. | |
| 7,811,470 B2 | 10/2010 | Hayes et al. | |
| 7,976,726 B2 | 7/2011 | Wang et al. | |
| 8,889,457 B2 | 11/2014 | Kurtin et al. | |
| 10,202,543 B2* | 2/2019 | Masson | C08K 9/10 |
| 2003/0066998 A1* | 4/2003 | Lee | G02B 6/122 257/19 |
| 2006/0105481 A1 | 5/2006 | Boardman et al. | |
| 2006/0157686 A1 | 7/2006 | Jang et al. | |
| 2007/0185261 A1 | 8/2007 | Lee et al. | |
| 2008/0173886 A1* | 7/2008 | Cheon | H01L 33/501 257/98 |
| 2010/0003528 A1 | 1/2010 | Rozhin et al. | |
| 2010/0123155 A1 | 5/2010 | Pickett et al. | |
| 2010/0276638 A1 | 11/2010 | Liu et al. | |
| 2011/0068321 A1 | 3/2011 | Pickett et al. | |
| 2011/0240931 A1 | 10/2011 | Jang et al. | |
| 2012/0241646 A1* | 9/2012 | Zhong | B82Y 40/00 250/459.1 |
| 2014/0166945 A1 | 6/2014 | Kurtin et al. | |
| 2015/0203747 A1 | 7/2015 | Haley et al. | |

FOREIGN PATENT DOCUMENTS

| | | |
|---|---|---|
| KR | 20120035152 A | 4/2012 |
| WO | 2005067524 A2 | 7/2005 |
| WO | 2008025962 A1 | 3/2008 |
| WO | 2010109465 A1 | 9/2010 |
| WO | 2011109299 A1 | 9/2011 |
| WO | 2012078582 A1 | 6/2012 |

OTHER PUBLICATIONS

Extended European Search Report for European Patent Application No. 14759513.6, dated Oct. 11, 2016, 4 pages.
Final Office Action for U.S. Appl. No. 14/196,123, dated Mar. 20, 2018, 7 pages.
Final Office Action for U.S. Appl. No. 14/196,123, dated Apr. 14, 2016, 12 pages.
Final Office Action for U.S. Appl. No. 14/341,657, dated Apr. 20, 2017, 13 pages.
Final Office Action for U.S. Appl. No. 14/341,657, dated May 12, 2016, 14 pages.
International Preliminary Report on Patentability for International Patent Application No. PCT/US2014/020813, dated Sep. 17, 2015, 13 pages.
International Search Report and Written Opinion for International Patent Application No. PCT/US2014/020813, dated Jun. 20, 2014, 16 pages.
Non-Final Office Action for U.S. Appl. No. 14/196,123, dated Jul. 16, 2018, 8 pages.
Non-Final Office Action for U.S. Appl. No. 14/196,123, dated Oct. 15, 2015, 21 pages.
Non-Final Office Action for U.S. Appl. No. 14/196,123, dated Nov. 22, 2017, 7 pages.
Non-Final Office Action for U.S. Appl. No. 14/341,657, dated Dec. 2, 2016, 16 pages.
Non-Final Office Action for U.S. Appl. No. 14/341,657, dated Dec. 17, 2015.
Notice of Allowance for U.S. Appl. No. 14/196,123, dated Oct. 31, 2018, 5 pages.
Notice of Allowance for U.S. Appl. No. 14/799,495, dated May 2, 2017, 9 pages.

\* cited by examiner

WHITE LIGHT

QUANTUM DOT (QD) DELIVERY METHOD

CROSS-REFERENCE TO RELATED APPLICATIONS

This application is a divisional of U.S. patent application Ser. No. 14/196,123, filed on Mar. 4, 2014, now issued as U.S. Pat. No. 10,202,543, on Feb. 12, 2020, which claims the benefit of U.S. Provisional Application No. 61/773,084, filed Mar. 5, 2013, the entire contents of which are hereby incorporated by reference herein.

TECHNICAL FIELD

Embodiments of the present invention are in the field of quantum dots and, in particular, quantum dot delivery methods.

BACKGROUND

Quantum dots having a high photoluminescence quantum yield (PLQY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include quantum dot delivery methods.

In an embodiment, a method of delivering or storing a plurality of nano-particles involves providing a plurality of nano-particles. The method also involves forming a dispersion of the plurality of nano-particles in a medium for delivery or storage, wherein the medium is free of organic solvent.

In another embodiment, a composition for delivery or storage of nano-particles includes a vinyl-containing poly (phenylmethylsiloxane) polymer. A plurality of nano-particles is dispersed in the vinyl-containing poly(phenylmethylsiloxane) polymer.

In another embodiment, a method of delivering or storing a plurality of nano-particles involves providing a plurality of nano-particles in an organic solvent. The method also involves drying the plurality of nano-particles for delivery or storage, the drying removing entirely all of the organic solvent.

DETAILED DESCRIPTION

Figure 1A:
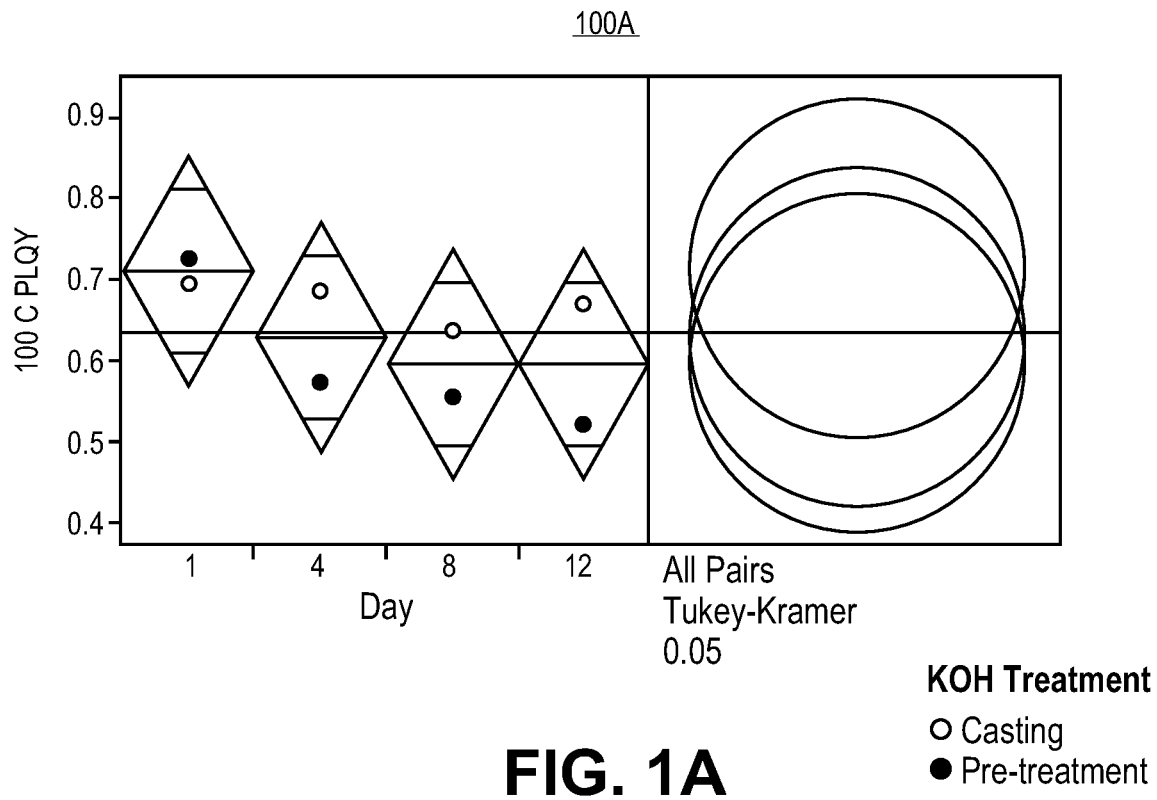
FIG. 1A is a graph showing one-way analysis of quantum dot samples over the course of twelve days for quantum dots delivered as a vinyl-containing poly(phenylmethylsiloxane) polymer solution, in accordance with an embodiment of the present invention.

Quantum dot delivery methods are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to approaches for delivering stable quantum dot materials for processing into matrix materials without difficulty and without changing the properties of the quantum dots themselves. Several different approaches for quantum dot or nano-particle delivery are described herein.

To provide context, quantum dots are synthesized colloidally and, after purifying with excess reagents, are typically stored in an organic solvent such as toluene. Often, when quantum dots are manufactured for commercial purposes they are delivered dissolved in the organic solvent. However, delivering quantum dots in a solvent to end-users who wish to further process the quantum dots into a matrix may be problematic for several reasons. First, quantum dots often require the presence of ligands on the quantum dot surfaces for maintaining the optical properties and structural integrity of the quantum dots. However, the ligands present on the quantum dot surfaces can diffuse in a solvent and, as such, the properties of quantum dots may change over time if stored in this way, whether the storage is at a manufacturing facility or an end-user facility. Second, end-users may prefer not to handle the solvents typically used for storage of quantum dots, such as toluene, due to the significant fire and health hazards and the general trend toward reducing volatile organic compounds in industrial settings. Third, the presence of even trace amounts of a carrier solvent may negatively impact the curing properties of a final quantum dot composite, for example, if the final matrix material is a polymer. Fourth, quantum dots stored in solvent may have a short shelf-life since the particles typically have a higher tendency to irreversibly agglomerate and therefore change properties over time. It is to be appreciated that, conventionally, quantum dots are typically shipped in solution (e.g., as dissolved in an organic solvent or water) or as a powder.

To address the above issues, in accordance with one or more embodiments of the present invention, alternative approaches for delivering stable quantum dot materials are described herein. Such approaches may enable further processing of the delivered quantum dot material into a final matrix material without difficulty and without changing the properties of the quantum dots themselves. In at least one such embodiment, quantum dot performance for quantum dots delivered by approaches described herein was unchanged as compared to analogous quantum dots stored in a solvent.

In a first aspect, some embodiments involve delivery methods compatible for an end-use that ultimately involves mixing quantum dots into a silicone polymer. In one such embodiment, quantum dots are delivered as dispersed in a polymer bearing the same functional groups as standard light emitting diode (LED) polymer encapsulants, enabling elimination of the use of an organic solvent as a dispersant while ensuring compatibility between the carrier and LED polymers. In another embodiment, quantum dots are delivered in one part of a two-part silicone formulation, again enabling elimination of the use of an organic solvent as a dispersant. In an embodiment, in either case, a permanent or end-user composite having a dispersion of the nano-particles or quantum dots therein may be fabricated. In another embodiment, in either case, additives to benefit the performance of quantum dots are be added to the quantum dot mixture for shipping, or at the point of mixing/curing/formation of the final end-user composite.

In an exemplary embodiment, a vinyl-terminated poly(phenylmethylsiloxane) (the most preferred PMV-9925) is used as a dispersion medium for delivering quantum dots to a final polymer composite which would comprise a vinyl-terminated poly(phenylmethylsiloxane)-QD and methyl or phenyl-based silicone mixture. In a specific embodiment, solvent was removed from quantum dots and the quantum dots (QD) were re-dispersed into PMV-9925. In a specific embodiment, a strong base (e.g., KOH) is added to the vinyl-terminated poly(phenylmethylsiloxane)-QD mix. The vinyl-terminated poly(phenylmethylsiloxane)-QD mix containing a strong base (e.g. KOH) were then added to a phenyl-based silicone (at a preferred weight ratio of 1:5 QD mixture:silicone) The resulting mixture was cured and then tested for performance (e.g., by measurement of photoluminescent quantum yield, PLQY). The measurements were made at both room temperature and 100 degrees Celsius. The silicone/PMV samples were prepared and tested from the same PMV/QD stock solution over the course of 12 days, and no significant change in performance was observed.

FIG. 1A is a graph 100A showing one-way analysis of quantum dot samples over the course of twelve days for quantum dots delivered as a PMV-9925 solution, in accordance with an embodiment of the present invention. Referring to graph 100A, quantum dot samples were treated with base (KOH) in two manners: prior to dispersing in PMV-9925 and after dispersing in PMV-9925 on the day of film casting. Samples dispersed in PMV-9925 and treated with base on the day of film casting show no significant change in performance at 100 degrees Celsius.

Figure 1B:
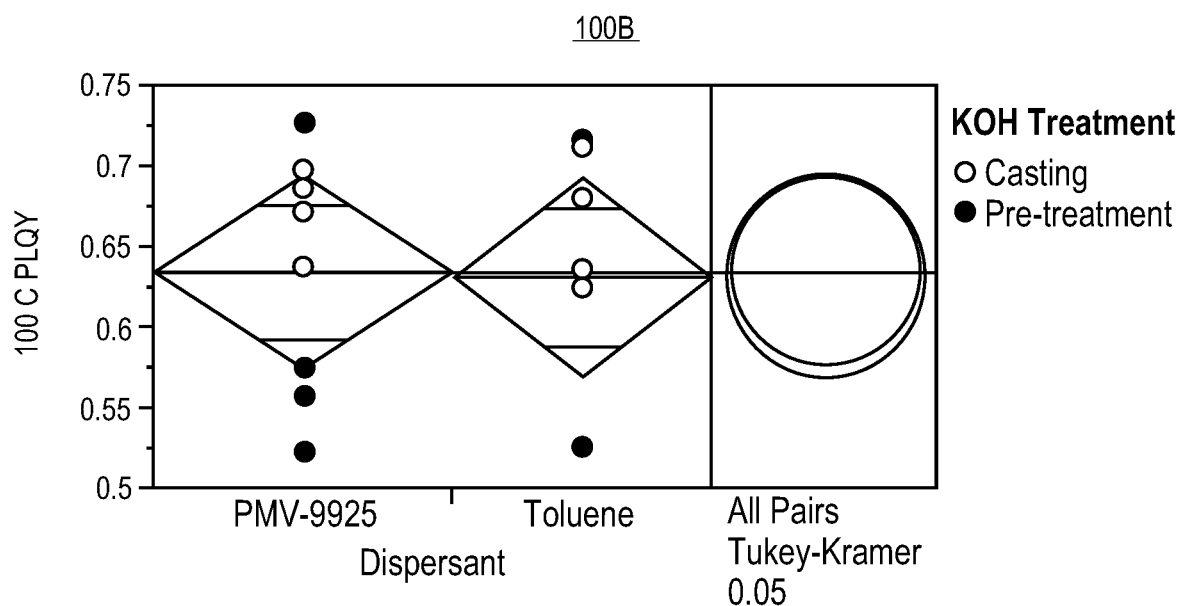
FIG. 1B is a graph showing one-way analysis of quantum dot samples dispersed in two different media: a solvent (toluene) and a vinyl-containing poly(phenylmethylsiloxane) polymer (PMV-9925), in accordance with an embodiment of the present invention.

FIG. 1B is a graph 100B showing one-way analysis of quantum dot samples dispersed in two different media: a solvent (toluene) and a polymer (PMV-9925), in accordance with an embodiment of the present invention. Referring to graph 100B, there is no significant different between the two media in relationship to their performance at 100 degrees Celsius. Thus, a performance comparison between quantum dots delivered in solvent (e.g., toluene in this case) and quantum dots delivered in PMV exhibit no statistical difference in PLQY.

In a second aspect, other embodiments involve drying the quantum dots for delivery. In an exemplary embodiment, a plurality of quantum dots is prepared as a powder by a freeze-drying process, also known as lyophilization, which involves removal of an organic solvent by applying vacuum to a solid state dispersion of quantum dots. In one such embodiment, the solid state dispersion is obtained by freezing to a temperature below the melting point of the solvent. In another exemplary embodiment, a plurality of quantum dots is prepared as a powder by removal of a solvent from a quantum dot dispersion using a rotary evaporator or a distillation apparatus followed by complete removal of any residual solvent retained in the solid mass of quantum dot particles. In one such embodiment, the residual solvent is removed by purging using an inert gas such as nitrogen ($N_2$) while the quantum dot particles are exposed to temperatures approximately in the range of 60 to 150 degrees Celsius. In an embodiment, whether dried by lyophilization or by purging with an inert gas, additives to benefit the performance of the quantum dots can be added to the quantum dot mixture for shipping, or at the point of mixing/curing/formation of the final end-user composite (which may include a dispersion of the nano-particles or quantum dots therein). It is to be appreciated that other drying approaches may also be used to prepare quantum dots for delivery.

Figure 2A:
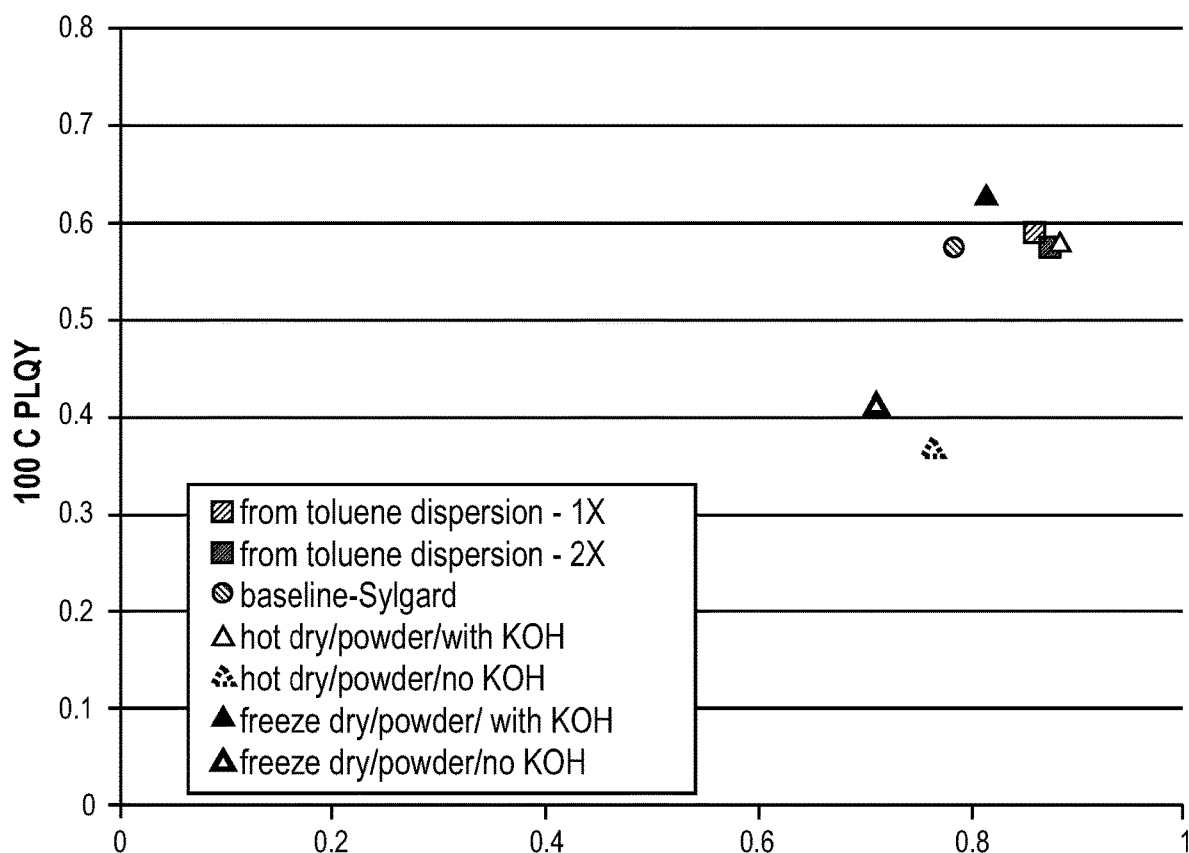
FIG. 2A is a plot of PLQY at 100 degrees Celsius versus room temperature showing luminescent nano-composite performance of films including quantum dots, in accordance with an embodiment of the present invention.

In accordance with an exemplary embodiment, FIG. 2A is a plot 200A of PLQY at 100 degrees Celsius versus room temperature showing luminescent nano-composite performance of films including quantum dots. Referring to plot 200A, films were prepared with light emitting diode (LED)-grade silicones to which quantum dot (QD) particles were incorporated by mixing with a toluene dispersion of the QD, QDs dried with heat, and QDs dried at low temperatures. Samples prepared from particles in toluene and particles which were dried in two different ways performed comparably. Any difference in performance observed here may arise from using a base (e.g., KOH in this case) as an additive to boost the photoluminescence quantum yield (PLQY), and not from the drying protocol. It is to be appreciated that based addition other than KOH may be used to boost PLQY.

Figure 2B:
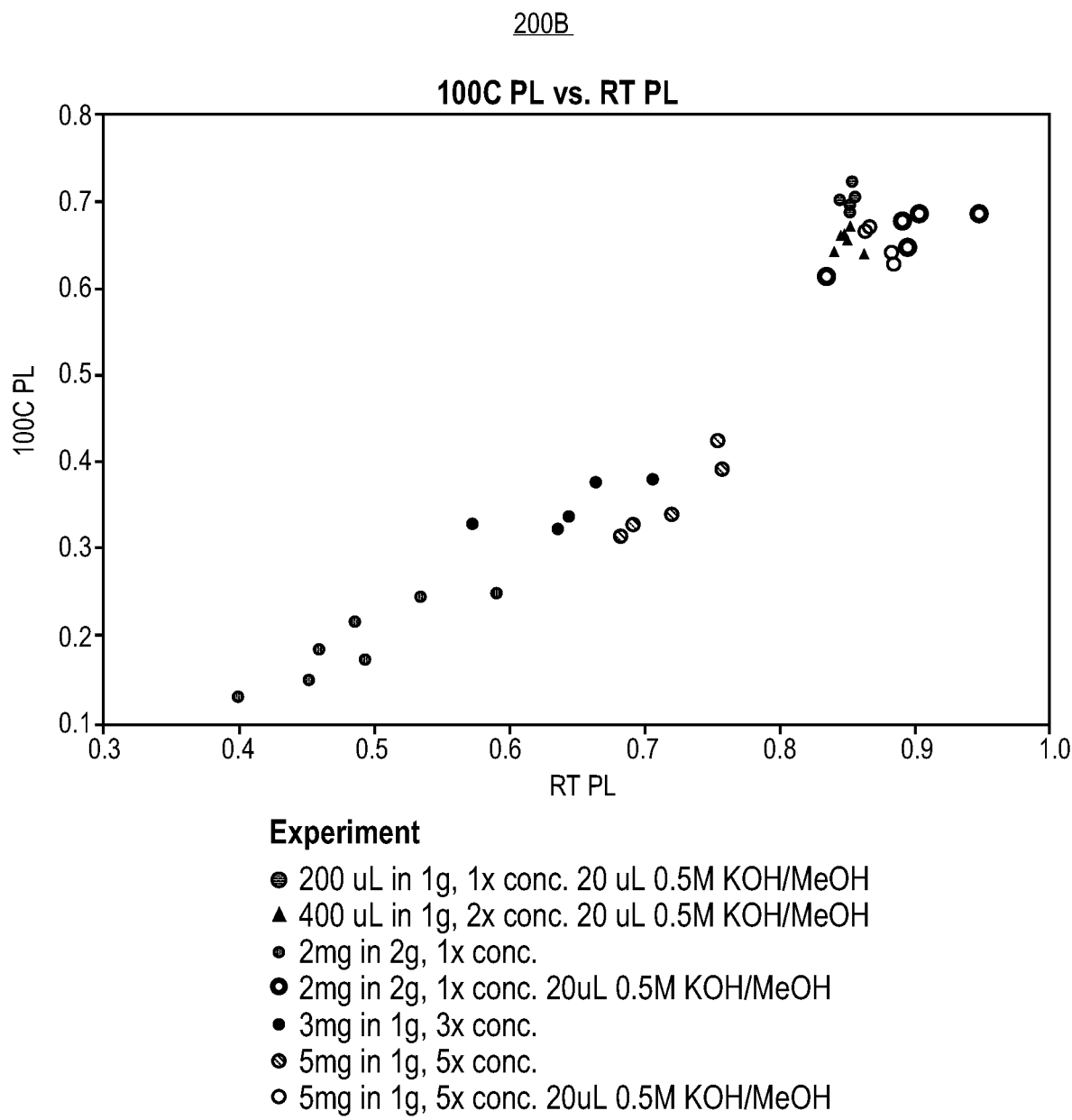
FIG. 2B is a plot of PLQY at 100 degrees Celsius versus room temperature showing luminescent nano-composite performance of films including quantum dots, in accordance with an embodiment of the present invention.

In accordance with another exemplary embodiment, FIG. 2B is a plot 200B of PLQY at 100 degrees Celsius versus room temperature showing luminescent nano-composite performance of films including quantum dots. Referring to plot 200B, luminescent nano-composite performance is provided for films prepared with LED grade silicones to which QD particles (open dots) were incorporated by mixing with a toluene dispersion of the QDs or with freeze-dried QDs at different concentrations, along with a base. The solid dots represent performance of nano-composites prepared with freeze-dried particles but to which KOH was not added. A very similar trend is observed for films prepared with particles from toluene dispersions. It is to be appreciated that based addition other than KOH may be used to boost PLQY.

Figure 3:
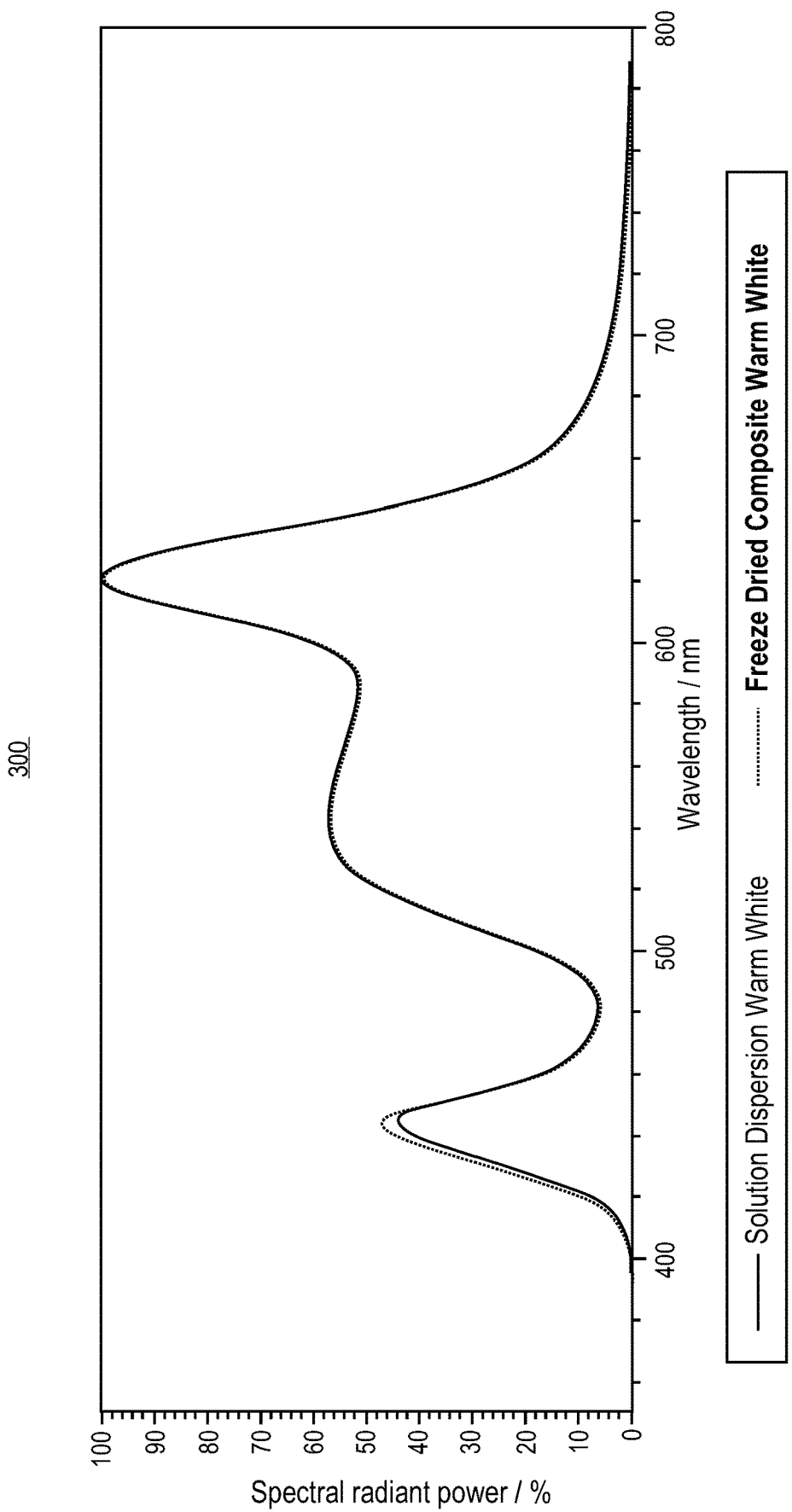
FIG. 3 is a plot of spectral radiant power (%) as a function of wavelength (nm) comparing performance of freeze-dried quantum dot heterostructures (QDH) along with solution dispersion QDH in the fabrication of a warm white phosphor film, in accordance with an embodiment of the present invention.

In accordance with another exemplary embodiment, FIG. 3 is a plot 300 of spectral radiant power (%) as a function of wavelength (nm) comparing performance of freeze-dried quantum dot heterostructures (QDH) along with solution dispersion QDH in the fabrication of a warm white phosphor film. Referring to plot 300, the freeze-dried approach maintains the same color quality and color rendering as compared to the solution dispersion method. Plot 300 also reveals that the freeze-dried nano-powder and the green phosphor powder do not aggregate together in the matrix which would otherwise be detrimental to performance.

Figure 4:
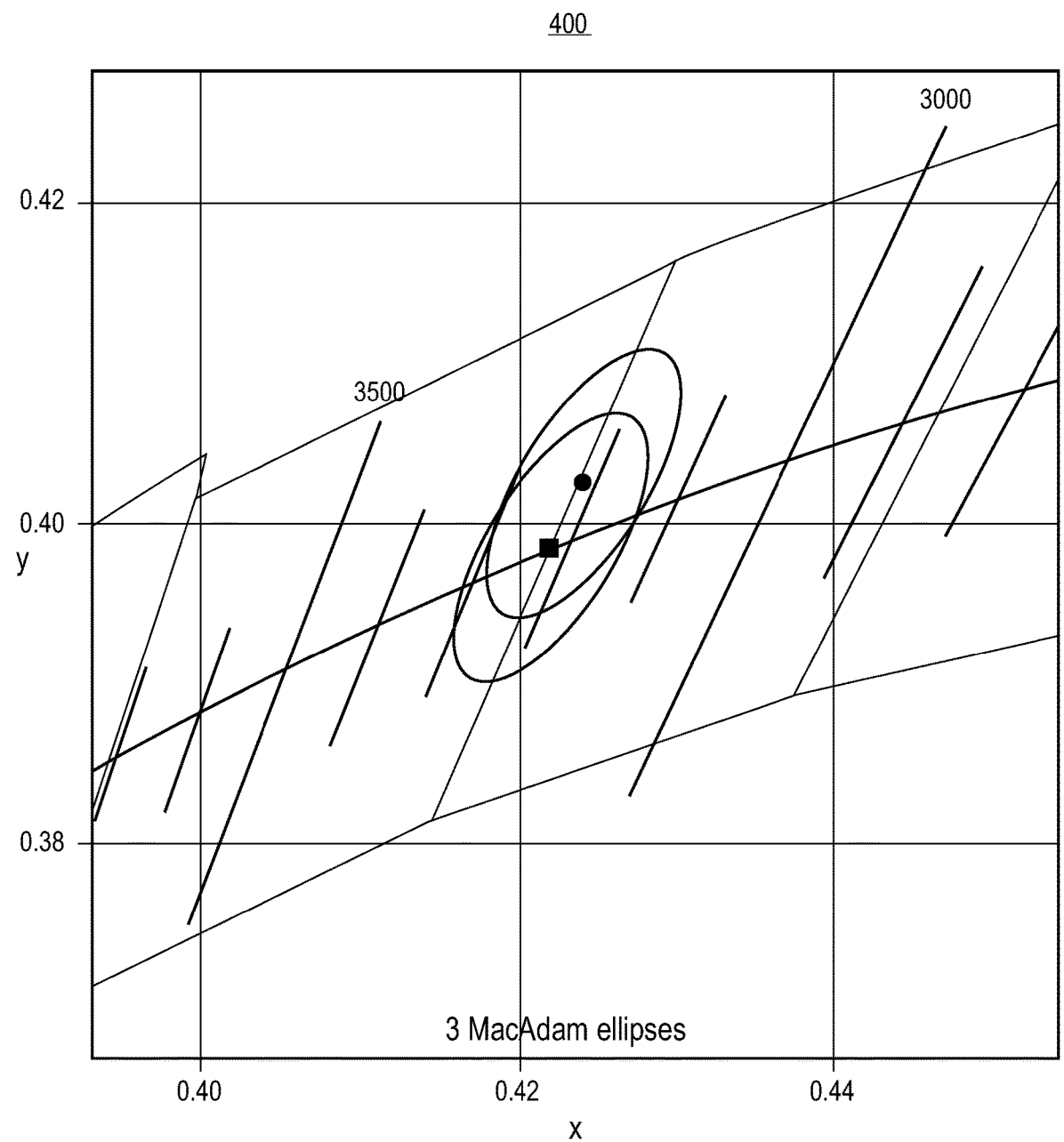
FIG. 4 is a CIE 1931 plot of freeze-dried warm white film (square) compared to solution dispersion warm white film (circle), in accordance with an embodiment of the present invention.

In accordance with another exemplary embodiment, FIG. 4 is a CIE 1931 plot 400 of freeze-dried warm white film (square) compared to solution dispersion warm white film (circle). Referring to plot 400, both approaches provide results that are within a 3-step MacAdam ellipse.

Figure 5:
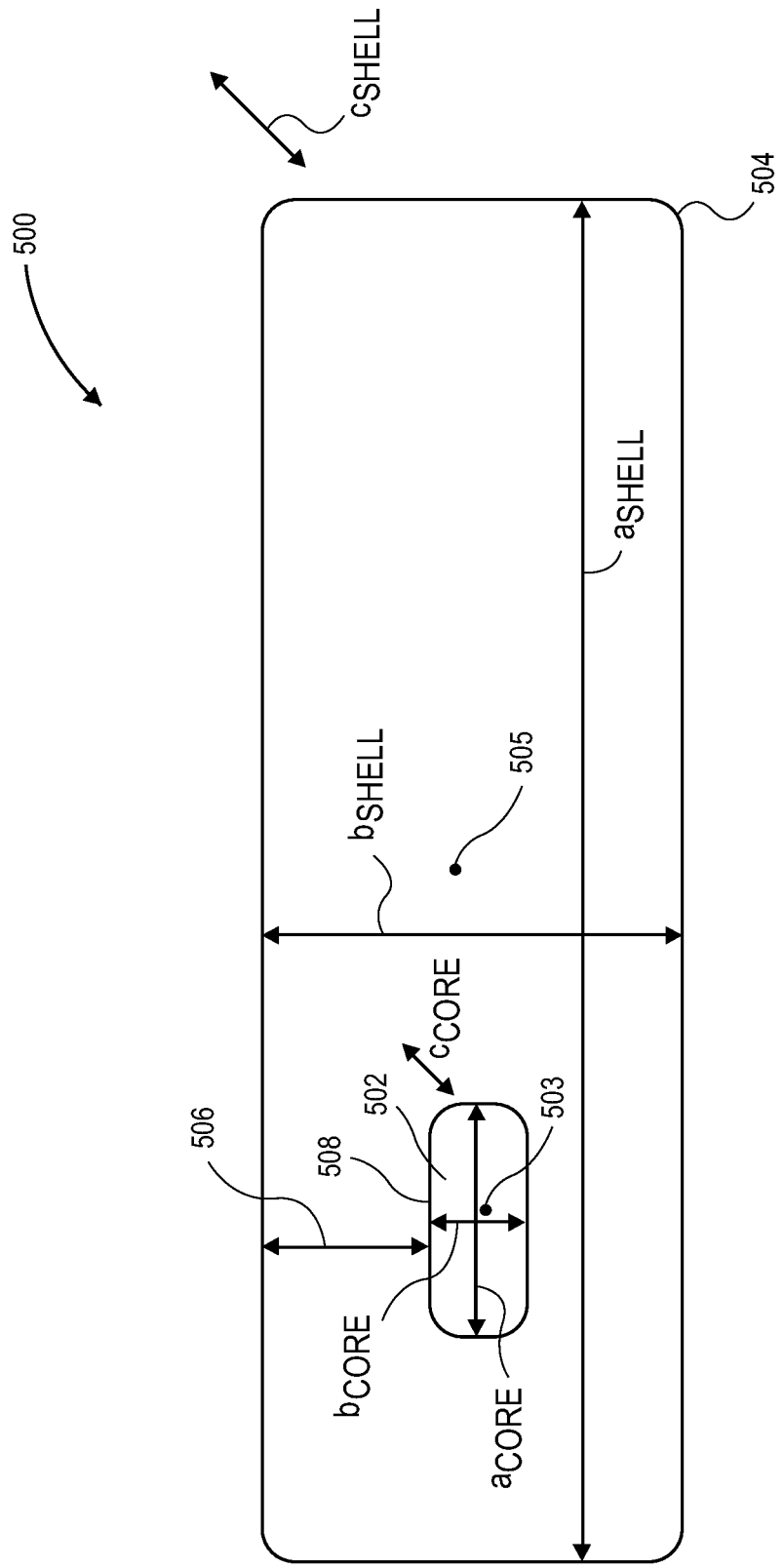
FIG. 5 illustrates a schematic of a cross-sectional view of a quantum dot suitable for delivery by approaches described herein, in accordance with an embodiment of the present invention.

In another aspect, the above described delivery approaches can be used to deliver nano-particles, such as hetero-structure-based quantum dots. Such hetero-structures may have specific geometries suitable for performance optimization. In an example, several factors may be intertwined for establishing an optimized geometry for a quantum dot having a nano-crystalline core and nano-crystalline shell pairing. As a reference, FIG. 5 illustrates a schematic of a cross-sectional view of a quantum dot suitable for delivery by approaches described herein, in accordance with an embodiment of the present invention. Referring to FIG. 5, a semiconductor structure (e.g., a quantum dot structure) 500 includes a nano-crystalline core 502 surrounded by a nano-crystalline shell 504. The nano-crystalline core 502 has a length axis ($a_{CORE}$), a width axis ($b_{CORE}$) and a depth axis ($c_{CORE}$), the depth axis provided into and out of the plane shown in FIG. 5. Likewise, the nano-crystalline shell 504 has a length axis ($a_{SHELL}$), a width axis ($b_{SHELL}$) and a depth axis ($c_{SHELL}$), the depth axis provided into and out of the plane shown in FIG. 5. The nano-crystalline core 502 has a center 503 and the nano-crystalline shell 504 has a center 505. The nano-crystalline shell 504 surrounds the nano-crystalline core 502 in the b-axis direction by an amount 506, as is also depicted in FIG. 5.

The following are attributes of a quantum dot that may be tuned for optimization, with reference to the parameters provided in FIG. 5, in accordance with embodiments of the present invention. Nano-crystalline core 502 diameter (a, b or c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 506 may be tuned for yield optimization and quantum confinement providing approaches to control red-shifting and mitigation of surface effects. However, strain considerations must be accounted for when optimizing the value of thickness 506. The length ($a_{SHELL}$) of the shell is tunable to provide longer radiative decay times as well as increased light absorption. The overall aspect ratio of the structure 500 (e.g., the greater of $a_{SHELL}/b_{SHELL}$ and $a_{SHELL}/c_{SHELL}$) may be tuned to directly impact PLQY. Meanwhile, overall surface/volume ratio for 500 may be kept relatively smaller to provide lower surface defects, provide higher photoluminescence, and limit self-absorption. Referring again to FIG. 5, the shell/core interface 508 may be tailored to avoid dislocations and strain sites. In one such embodiment, a high quality interface is obtained by tailoring one or more of injection temperature and mixing parameters, the use of surfactants, and control of the reactivity of precursors.

In accordance with an embodiment of the present invention, a high PLQY quantum dot is based on a core/shell pairing using an anisotropic core. With reference again to FIG. 5, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 5, the center 503 of the core 502 may be misaligned with (e.g., have a different spatial point than) the center 505 of the shell 504. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis (e.g., $a_{SHELL}$) and a short axis (e.g., $b_{SHELL}$), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials, Group III-V materials, Group IV-VI materials, Group materials, or Group II-IV-VI materials and, in one embodiment, are mono-crystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nano-crystalline outer shell at least partially surrounding the nano-crystalline shell and, in one embodiment, the nano-crystalline outer shell completely surrounds the nano-crystalline shell. The nano-crystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor structures, e.g., quantum dots, suitable for delivery by approaches described herein may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

More specifically, as is described in greater detail below in association with FIGS. 6-8, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 6:
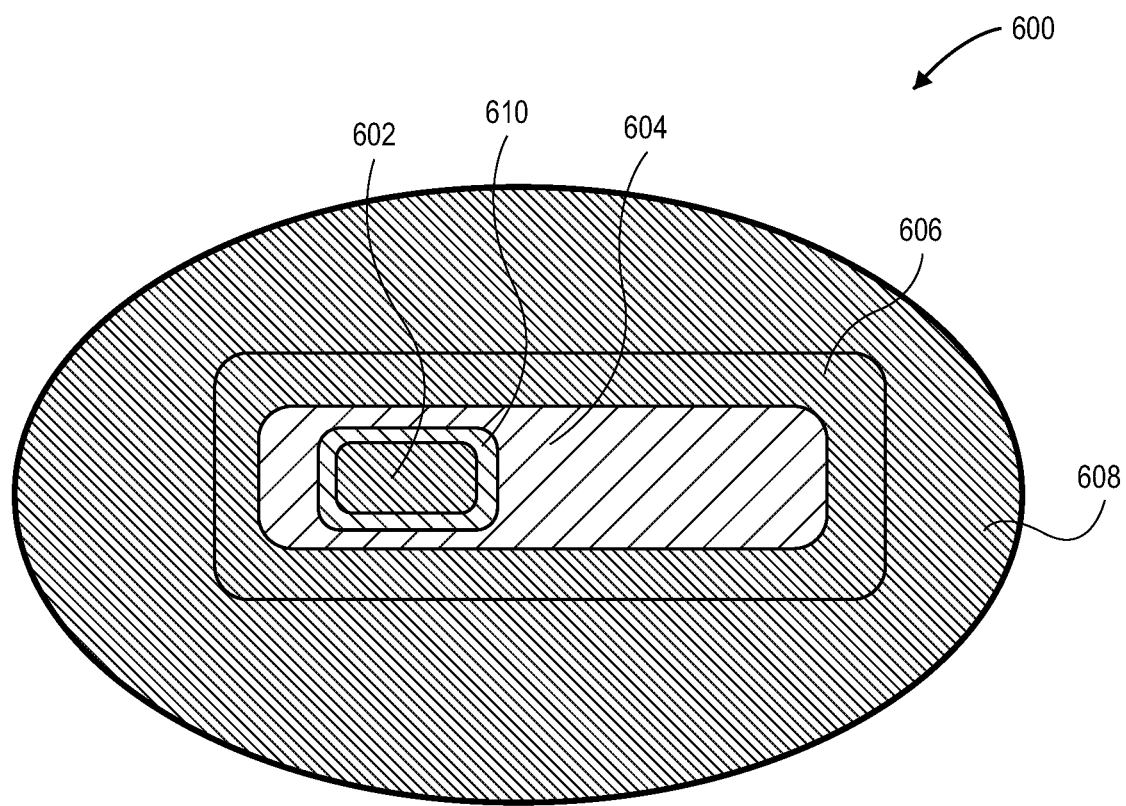
FIG. 6 illustrates a cross-sectional view of a semiconductor structure having a nano-crystalline core and nano-crystalline shell pairing with one compositional transition layer, in accordance with an embodiment of the present invention.

In a first example, FIG. 6 illustrates a cross-sectional view of a semiconductor structure having a nano-crystalline core and nano-crystalline shell pairing with one compositional transition layer, in accordance with an embodiment of the present invention.

Referring to FIG. 6, a semiconductor structure 600 includes a nano-crystalline core 602 composed of a first semiconductor material. A nano-crystalline shell 604 composed of a second, different, semiconductor material at least partially surrounds the nano-crystalline core 602. A compositional transition layer 610 is disposed between, and in contact with, the nano-crystalline core 602 and nano-crystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nano-crystalline core 602 through to the second semiconductor material proximate to the nano-crystalline shell 604. In either case, in a specific embodiment, the compositional transition layer 610 has a thickness approximately in the range of 1.5-2 monolayers. Exemplary embodiments include a structure 600 where the first semiconductor material is cadmium selenide (CdSe), the second semiconductor material is cadmium sulfide (CdS), and the compositional transition layer 610 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 610 is composed of $Cd_xZn_ySe$, where $0<x<1$ and $0<y<1$.

In accordance with an embodiment of the present invention, the compositional transition layer 610 passivates or reduces trap states where the nano-crystalline shell 604 surrounds the nano-crystalline core 602. Exemplary embodiments of core and/or shell parameters include a structure 600 where the nano-crystalline core 602 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 4-6.

In an embodiment, the nano-crystalline shell 604 completely surrounds the nano-crystalline core 602, as depicted in FIG. 6. In an alternative embodiment, however, the nano-crystalline shell 604 only partially surrounds the nano-crystalline core 602, exposing a portion of the nano-crystalline core 602. Furthermore, in either case, the nano-crystalline core 602 may be disposed in an asymmetric orientation with respect to the nano-crystalline shell 604. In one or more embodiments, semiconductor structures such as 600 are fabricated to further include a nano-crystalline outer shell 606 at least partially surrounding the nano-crystalline shell 604. The nano-crystalline outer shell 606 may be composed of a third semiconductor material different from the first and second semiconductor materials, i.e., different from the materials of the core 602 and shell 604. The nano-crystalline outer shell 606 may completely surround the nano-crystalline shell 604 or may only partially surround the nano-crystalline shell 604, exposing a portion of the nano-crystalline shell 604.

For embodiments including a nano-crystalline outer shell, an additional compositional transition layer may be included. Thus, in a second example, FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Figure 7:
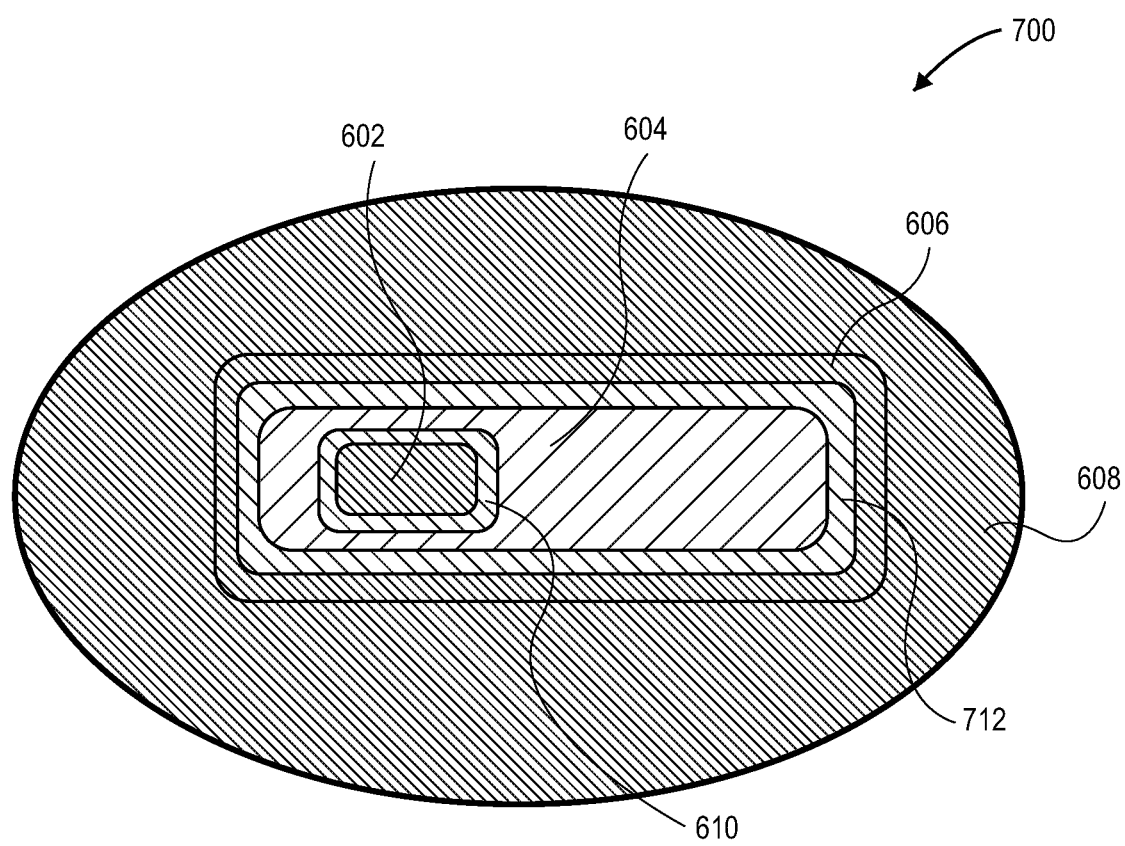
FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 7, a semiconductor structure 700 includes the nano-crystalline core 602, nano-crystalline shell 604, nano-crystalline outer shell 606 and compositional transition layer 610 of structure 600. However, in addition, semiconductor structure 700 includes a second compositional transition layer 712 disposed between, and in contact with, the nano-crystalline shell 604 and the nano-crystalline outer shell 606. The second compositional transition layer 712 has a composition intermediate to the second and third semiconductor materials, i.e., intermediate to the semiconductor materials of the shell 604 and outer shell 606.

In an embodiment, the second compositional transition layer 712 is an alloyed layer composed of a mixture of the second and third semiconductor materials. In another embodiment, the second compositional transition layer 712 is a graded layer composed of a compositional gradient of the second semiconductor material proximate to the nano-crystalline shell 604 through to the third semiconductor material proximate to the nano-crystalline outer shell 606. In either case, in a specific embodiment, the second compositional transition layer 712 has a thickness approximately in the range of 1.5-2 monolayers. Exemplary embodiments include a structure 700 where the first semiconductor material is cadmium selenide (CdSe), the second semiconductor material is cadmium sulfide (CdS), the third semiconductor material is zinc sulfide (ZnS), and the second compositional transition layer 712 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 712 is composed of $ZnSe_xS_y$, where $0<x<1$ and $0<y<1$. In accordance with an embodiment of the present invention, the second compositional transition layer 712 passivates or reduces trap states where the nano-crystalline outer shell 606 surrounds the nano-crystalline shell 604.

For other embodiments including a nano-crystalline outer shell, an outer compositional transition layer may be included without including an inner compositional transition layer. Thus, in a third example, FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Figure 8:
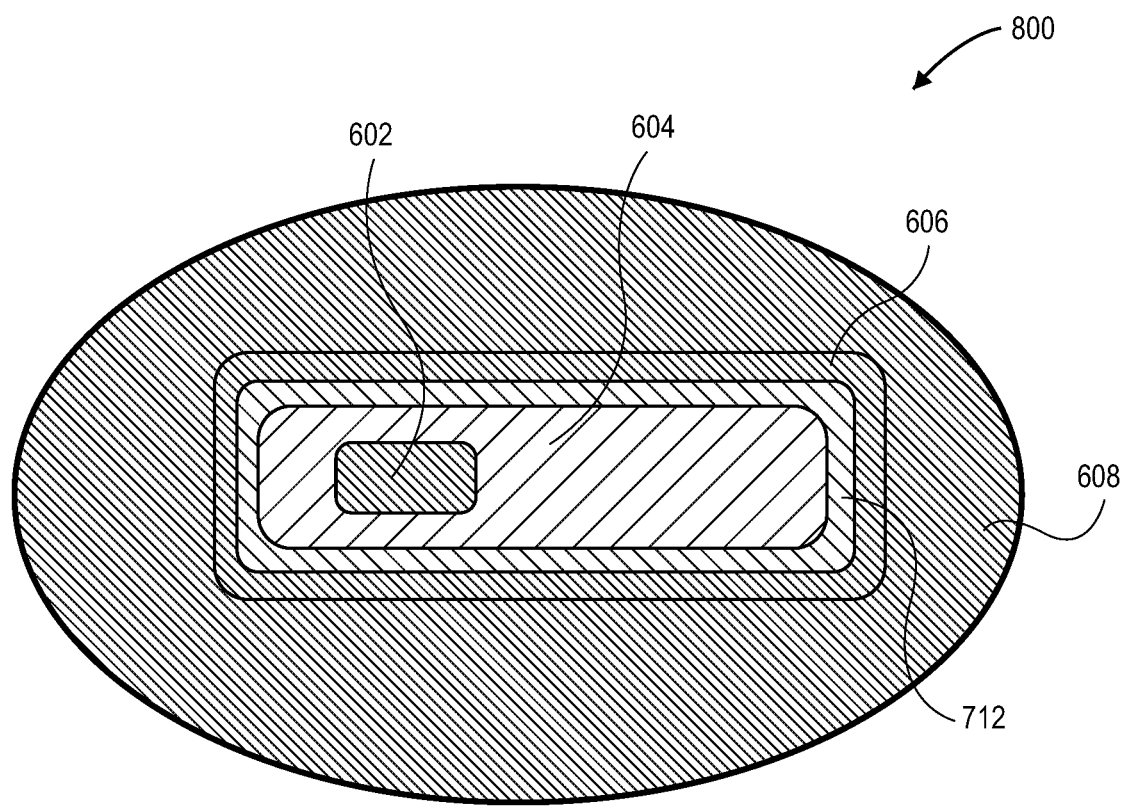
FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 8, a semiconductor structure 800 includes the nano-crystalline core 602, nano-crystalline shell 604, and nano-crystalline outer shell 606 of structure 600. In addition, the semiconductor structure 800 includes the compositional transition layer 712 of structure 700 disposed between, and in contact with, the nano-crystalline shell 604 and the nano-crystalline outer shell 606. However, structure 800 does not include the compositional transition layer 610 of structure 600, i.e., there is no compositional transition layer between the core 602 and shell 604.

Referring to FIGS. 5-8, and as depicted in FIGS. 6-8, the structures 500, 600, 700 and 800 may further include an insulator coating (e.g., shown as 608 in FIGS. 6-8) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structures 500, 600, 700 and 800 are quantum dot structures. For example, structures 500, 600, 700 and 800 may be used as a down-converting quantum dot or an up-shifting quantum dot.

Figure 9:
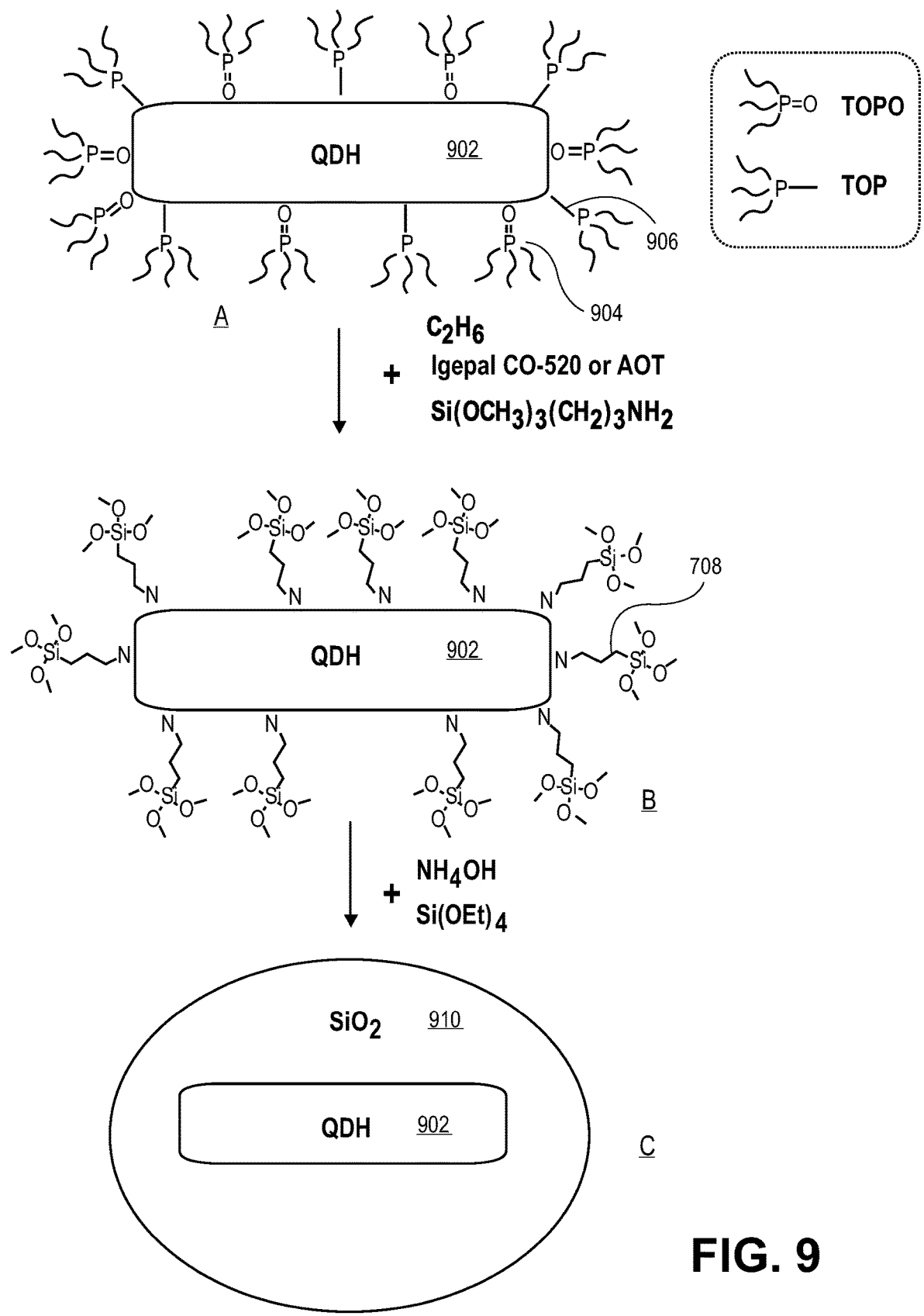
FIG. 9 illustrates operations in a reverse micelle approach to coating a semiconductor structure, in accordance with an embodiment of the present invention.

The above described insulator coating may be formed to encapsulate a quantum dot using a reverse micelle process. For example, FIG. 9 illustrates operations in a reverse micelle approach to coating a semiconductor structure, in accordance with an embodiment of the present invention. Referring to part A of FIG. 9, a quantum dot hetero-structure (QDH) 902 (e.g., a nano-crystalline core/shell pairing) has attached thereto a plurality of TOPO ligands 904 and TOP ligands 906. Referring to part B, the plurality of TOPO ligands 904 and TOP ligands 906 are exchanged with a plurality of $Si(OCH_3)_3(CH_2)_3NH_2$ ligands 908. The structure of part B is then reacted with TEOS ($Si(OEt)_4$) and ammonium hydroxide ($NH_4OH$) to form a silica coating 910 surrounding the QDH 902, as depicted in part C of FIG. 9.

In another aspect, nano-particles or quantum dots are delivered by approaches described herein for ultimate use in application for a lighting device, e.g., to provide a layer having a dispersion of semiconductor structures therein for inclusion in the lighting device. In one embodiment, the dispersion of semiconductor structures is a dispersion of quantum dots such as those described above in association with FIGS. 5-9.

Figure 10:
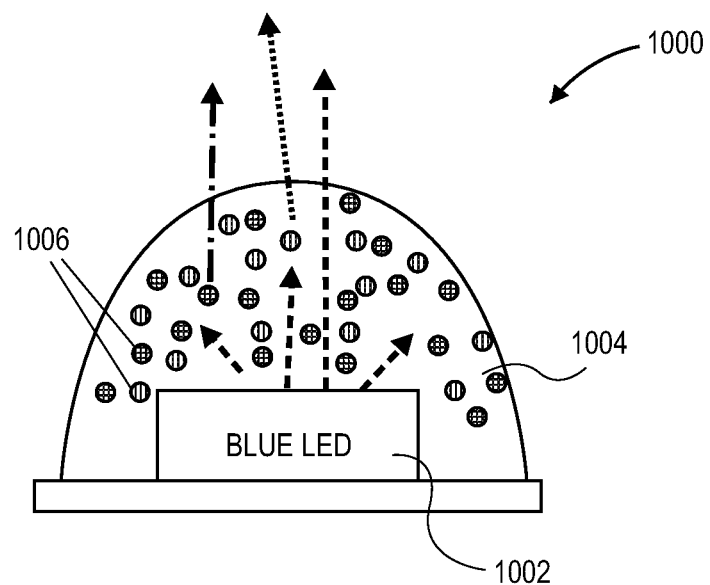
FIG. 10 illustrates a lighting device that includes a blue LED with a layer having a composition with a dispersion of quantum dots therein, in accordance with an embodiment of the present invention.

As an example, FIG. 10 illustrates a lighting device 1000. Device 1000 has a blue LED 1002 with a layer 1004 having a dispersion of quantum dots 1006 therein, in accordance with an embodiment of the present invention. Devices 1000 may be used to produce "cold" or "warm" white light. In one embodiment, the device 1000 has little to no wasted energy since there is little to no emission in the IR regime. In a specific such embodiment, the use of a layer having a composition with a dispersion of anisotropic quantum dots therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the composition, along with the dispersion of quantum dots 1006.

Figure 11:
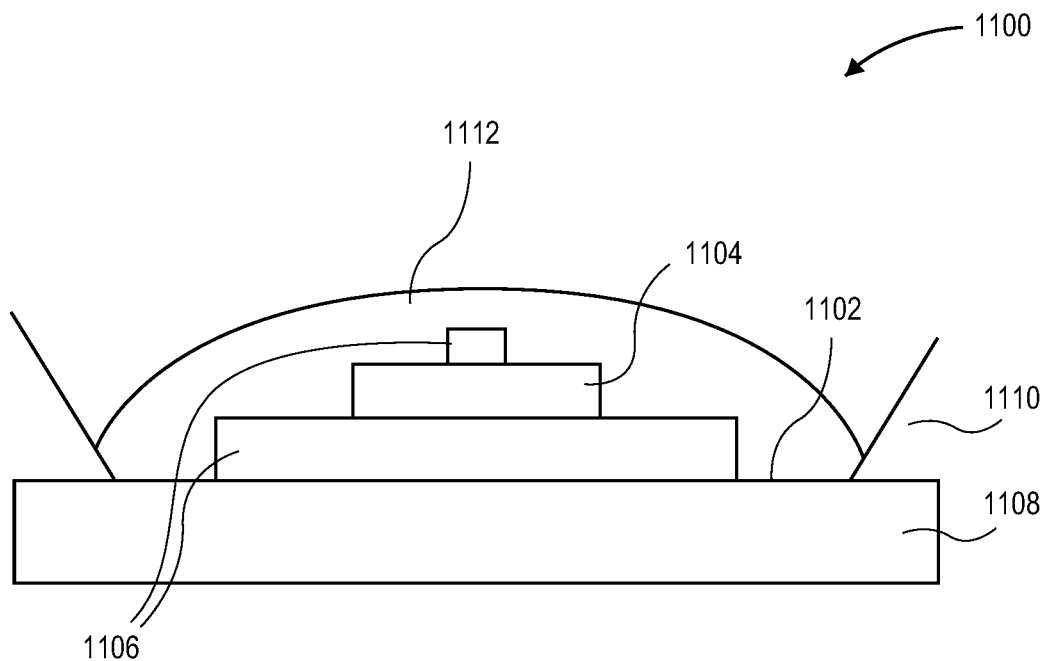
FIG. 11 illustrates a cross-sectional view of a lighting device with a layer having a composition with a dispersion of quantum dots therein, in accordance with an embodiment of the present invention.

Different approaches may be used to provide a quantum dot layer in a lighting device. In an example, FIG. 11 illustrates a cross-sectional view of a lighting device 1100 with a layer having a composition with a dispersion of quantum dots therein, in accordance with an embodiment of the present invention. Referring to FIG. 11, a blue LED structure 1102 includes a die 1104, such as an InGaN die, and electrodes 1106. The blue LED structure 1102 is disposed on a coating or supporting surface 1108 and housed within a protective and/or reflective structure 1110. A layer 1112 is formed over the blue LED structure 1102 and within the protective and/or reflective structure 1110. The layer 1112 has a composition including a dispersion of quantum dots or a combination of a dispersion of quantum dots and conventional phosphors. Although not depicted, the protective and/or reflective structure 1110 can be extended upwards, well above the matrix layer 1112, to provide a "cup" configuration.

Figure 12:
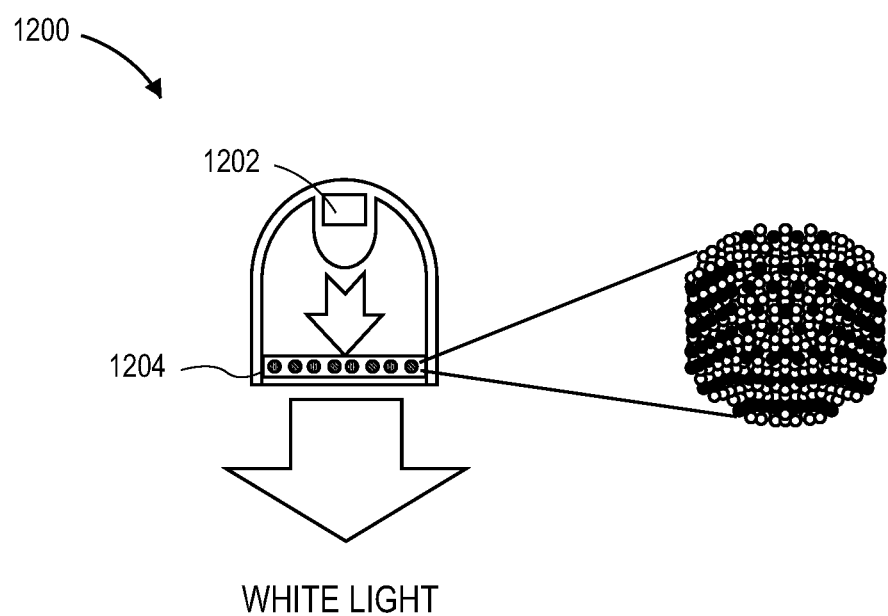
FIG. 12 illustrates a cross-sectional view of a lighting device with a layer having a composition with a dispersion of quantum dots therein, in accordance with another embodiment of the present invention.

In another example, FIG. 12 illustrates a cross-sectional view of a lighting device 1200 with a layer having a composition with a dispersion of quantum dots therein, in accordance with another embodiment of the present invention. Referring to FIG. 12, the lighting device 1200 includes a blue LED structure 1202. A quantum dot down converter screen 1204 is positioned somewhat remotely from the blue LED structure 1202. The quantum dot down converter screen 1204 includes a layer with a composition having a dispersion of quantum dots therein, e.g., of varying color, or a combination of a dispersion of quantum dots and conventional phosphors. In one embodiment, the device 1200 can be used to generate white light, as depicted in FIG. 12.

Figure 13:
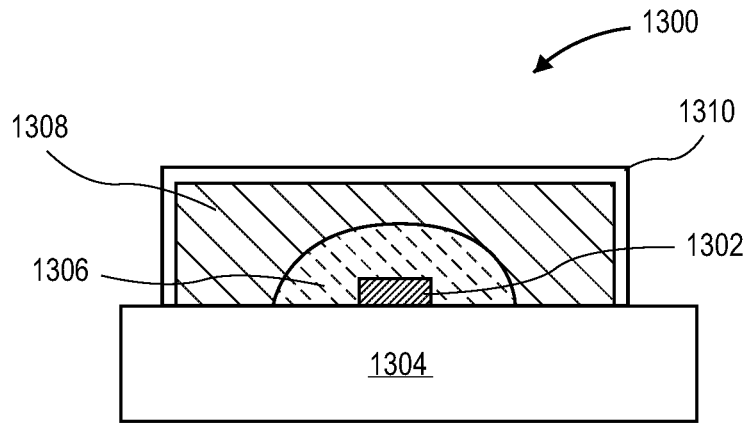
FIG. 13 illustrates a cross-sectional view of a lighting device with a layer having a composition with a dispersion of quantum dots therein, in accordance with another embodiment of the present invention.

In another example, FIG. 13 illustrates a cross-sectional view of a lighting device 1300 with a layer having a composition with a dispersion of quantum dots therein, in accordance with another embodiment of the present invention. Referring to FIG. 13, the lighting device 1300 includes a blue LED structure 1302 supported on a substrate 1304 which may house a portion of the electrical components of the blue LED structure 1302. A first conversion layer 1306 has a composition that includes a dispersion of red-light emitting anisotropic quantum dots therein. A second conversion layer 1308 has a second composition that includes a dispersion of quantum dots or green or yellow phosphors or a combination thereof (e.g., yttrium aluminum garnet, YAG phosphors) therein. Optionally, a sealing layer 1310 may be formed over the second conversion layer 1308, as depicted in FIG. 13. In one embodiment, the device 1300 can be used to generate white light.

Figure 14:
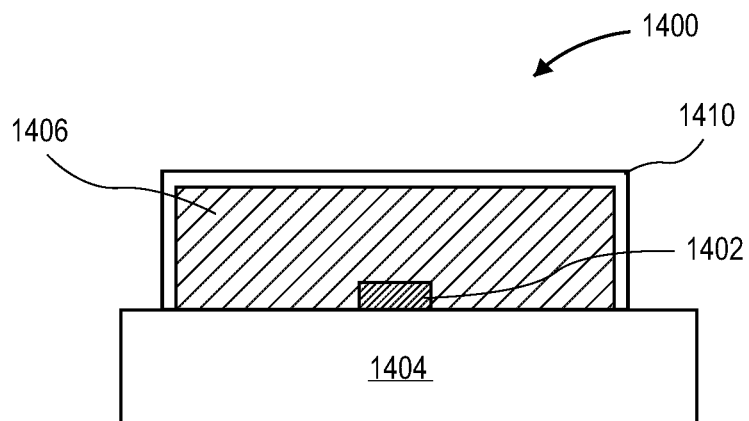
FIG. 14 illustrates a cross-sectional view of a lighting device with a layer having a composition with a dispersion of quantum dots therein, in accordance with another embodiment of the present invention.

In another example, FIG. 14 illustrates a cross-sectional view of a lighting device 1400 with a layer having a composition with a dispersion of quantum dots therein, in accordance with another embodiment of the present invention. Referring to FIG. 14, the lighting device 1400 includes a blue LED structure 1402 supported on a substrate 1404 which may house a portion of the electrical components of the blue LED structure 1402. A single conversion layer 1406 has a composition that includes a dispersion of red-light emitting anisotropic quantum dots in combination with a dispersion of green quantum dots or green and/or yellow phosphors therein. Optionally, a sealing layer 1410 may be formed over the single conversion layer 1406, as depicted in FIG. 14. In one embodiment, the device 1400 can be used to generate white light.

Figure 15A:
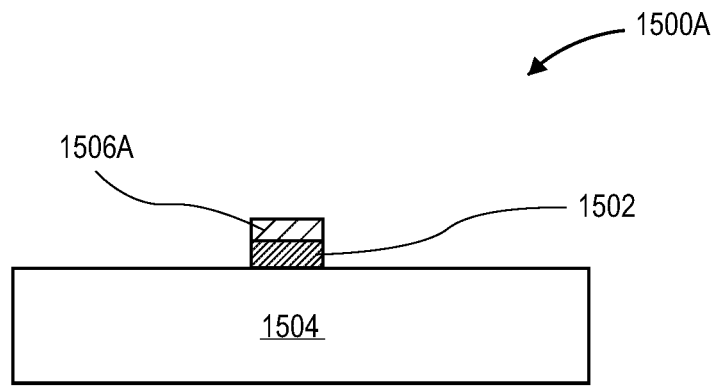
FIGS. 15A-15C illustrate cross-sectional views of various configurations for lighting devices with a layer having a composition with a dispersion of quantum dots therein, in accordance with another embodiment of the present invention.
Figure 15B:
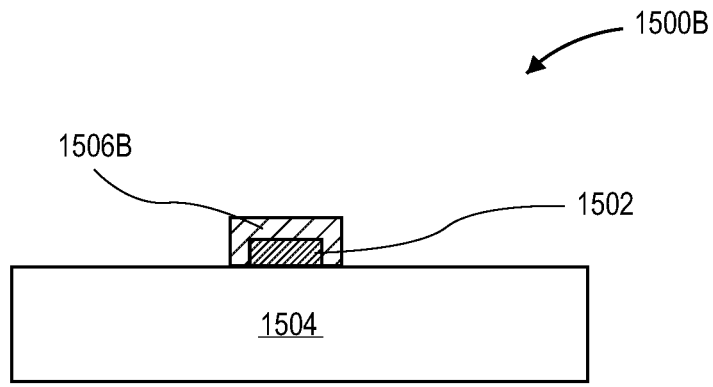
Figure 15C:
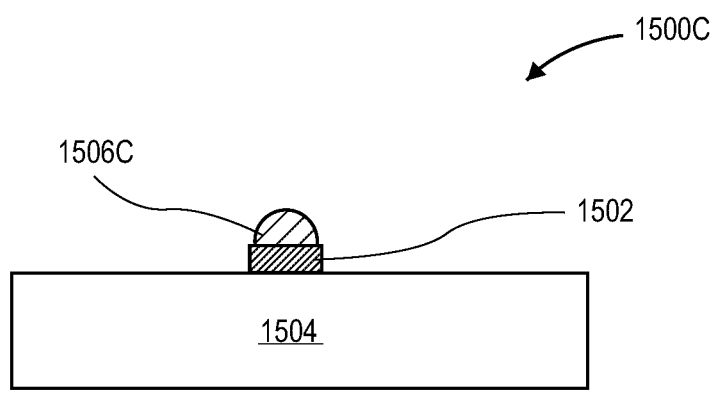

In additional examples, FIGS. 15A-15C illustrate cross-sectional views of various configurations for lighting devices 1500A-1500C with a layer having a composition with a dispersion of quantum dots therein, respectively, in accordance with another embodiment of the present invention. Referring to FIGS. 15A-15C, the lighting devices 1500A-1500C each include a blue LED structure 1502 supported on a substrate 1504 which may house a portion of the electrical components of the blue LED structure 1502. A conversion layer 1506A-1506C, respectively, has a composition that includes a dispersion of one or more light-emitting color types of quantum dots therein. Referring to FIG. 1500A specifically, the conversion layer 1506A is disposed as a thin layer only on the top surface of the blue LED structure 1502. Referring to FIG. 1500B specifically, the conversion layer 1506B is disposed as a thin layer conformal with all exposed surfaces of the blue LED structure 1502. Referring to FIG. 1500C specifically, the conversion layer 1506C is disposed as a "bulb" only on the top surface of the blue LED structure 1502. In the above examples (e.g., FIGS. 10-14 and 15A-15C), although use with a blue LED is emphasized, it is to be understood that a layer having a composition with a dispersion of quantum dots therein can be used with other light sources as well, including LEDs other than blue LEDs.

Thus, quantum dot delivery methods have been disclosed.

What is claimed is:

1. A composition for delivery or storage of quantum dots, comprising:
 a vinyl-containing poly(phenylmethylsiloxane) polymer;
 a plurality of quantum dots dispersed in the vinyl-containing poly(phenylmethylsiloxane) polymer; and
 a photo-luminescent quantum yield (PLQY) boosting agent comprising a base of potassium hydroxide (KOH).

2. The composition of claim 1, wherein the quantum dots are down-converting.

3. The composition of claim 1, wherein each of the quantum dots have a nano-crystalline core and nanocrystalline shell pairing.

4. The composition of claim 3, wherein the nano-crystalline core is an anisotropic nanocrystalline core composed of a first semiconductor material, and
 wherein the nanocrystalline shell is composed of a second, different, semiconductor material.

5. The composition of claim 3, wherein the nano-crystalline core is composed of a first semiconductor material,
 the nanocrystalline shell is composed of a second semiconductor material, and
 the first semiconductor material and the second semiconductor material are Group II-VI materials.

6. The composition of claim 3, wherein the nano-crystalline core is composed of a first semiconductor material,
 the nanocrystalline shell is composed of a second semiconductor material, and
 further comprising a nanocrystalline outer shell that completely surrounds the nanocrystalline shell, wherein the nanocrystalline outer shell is composed of a third semiconductor material different from the first semiconductor material and the second semiconductor material.

7. The composition of claim 3, wherein the nano-crystalline core is composed of a first semiconductor material,
 the nanocrystalline shell is composed of a second semiconductor material, and
 further comprising a composition transition layer disposed between and in contact with the nanocrystalline core and the nanocrystalline shell, wherein the composition transition layer has a composition intermediate to the first semiconductor material and the second semiconductor material.

\* \* \* \* \*